United States Patent
Sasaki et al.

(10) Patent No.: US 7,361,220 B2
(45) Date of Patent: Apr. 22, 2008

(54) METHOD OF MANUFACTURING GROUP III NITRIDE SINGLE CRYSTAL, DEVICE USED FOR THE METHOD AND GROUP III NITRIDE SINGLE CRYSTAL OBTAINED BY THE METHOD

(75) Inventors: Takatomo Sasaki, Suita (JP); Yusuke Mori, Katano (JP); Fumio Kawamura, Minoo (JP); Masashi Yoshimura, Takarazuka (JP); Yasunori Kai, Fukuoka (JP); Mamoru Imade, Minoo (JP); Yasuo Kitaoka, Ibaraki (JP); Hisashi Minemoto, Hirakata (JP); Isao Kidoguchi, Kawanishi (JP)

(73) Assignees: Matsushita Electric Industrial Co., Ltd., Osaka (JP); Takatomo Susaki, Osaka (JP)

( * ) Notice: Subject to any disclaimer, the term of this patent is extended or adjusted under 35 U.S.C. 154(b) by 136 days.

(21) Appl. No.: 10/809,033

(22) Filed: Mar. 25, 2004

(65) Prior Publication Data

US 2004/0250747 A1 Dec. 16, 2004

(30) Foreign Application Priority Data

Mar. 26, 2003 (JP) ............................. 2003-086562

(51) Int. Cl.
*C30B 23/00* (2006.01)
*C30B 25/00* (2006.01)
*C30B 28/12* (2006.01)

(52) U.S. Cl. ............................. 117/84; 117/88; 117/89; 117/91; 117/105

(58) Field of Classification Search .................. 117/84, 117/88, 89, 91, 105
See application file for complete search history.

(56) References Cited

U.S. PATENT DOCUMENTS 6,001,748 A * 12/1999 Tanaka et al. .............. 438/791

(Continued)

FOREIGN PATENT DOCUMENTS

EP 0 497 350 8/1992

(Continued)

OTHER PUBLICATIONS

English abstracts and computer translations of JP 2000-233993.*

(Continued)

*Primary Examiner*—Yogendra Gupta
*Assistant Examiner*—G. Nagesh Rao
(74) *Attorney, Agent, or Firm*—Hamre, Schumann, Mueller & Larson, P.C.

(57) ABSTRACT

The present invention provides a method of manufacturing a gallium nitride single crystal that can suppress the decomposition of gallium nitride and improve production efficiency in a sublimation method. According to the manufacturing method, a material (GaN powder) for the gallium nitride (GaN) single crystal is placed inside a crucible, sublimed or evaporated by heating, and cooled on a substrate surface to return to a solid again, so that the gallium nitride single crystal is grown on the substrate surface. The growth of the single crystal is performed under pressure. The pressure is preferably not less than 5 atm ($5 \times 1.013 \times 10^5$ Pa). The single crystal is grown preferably in a mixed gas atmosphere containing $NH_3$ and $N_2$.

48 Claims, 18 Drawing Sheets

U.S. PATENT DOCUMENTS

| | | | |
|---|---|---|---|
| 6,068,672 A * | 5/2000 | Watson et al. ................ 44/629 |
| 6,296,956 B1 * | 10/2001 | Hunter ....................... 428/698 |
| 6,362,494 B1 * | 3/2002 | Yagi ............................ 257/76 |
| 6,770,135 B2 * | 8/2004 | Schowalter et al. ........ 117/106 |
| 6,946,308 B2 | 9/2005 | Hiramatsu et al. |
| 2006/0183625 A1 * | 8/2006 | Miyahara ................... 501/98.4 |

FOREIGN PATENT DOCUMENTS

| | | |
|---|---|---|
| JP | 63-188938 | 8/1988 |
| JP | 4-297023 | 10/1992 |
| JP | 2000-233993 | 8/2000 |
| JP | 2002-184701 | 6/2002 |
| JP | 2004-006568 | 1/2004 |
| WO | 95/04845 | 2/1995 |
| WO | 2004/013385 | 2/2004 |

OTHER PUBLICATIONS

Kurai et al., "Nucleation Control in the Growth of Bulk GaN by Submission Method", Jpn. J. Appl. Phys., vol. 36 (1997), pp. L184-L186, Part 2, No. 2B, Feb. 15, 1997.

Nishino et al., "Bulk GaN Growth by Direct Synthesis Method", Journal of Crystal Growth, 237-239 (2002) 922-925.

Karpov, et al., "Effect of Reactive Ambient on AlN Sublimation Growth", Phys. Stat. Sol. (a) 188, No. 2, 763-767 (2001).

Imade et al., "Growth of Bulk GaN Single Crystals by High-Pressure Sublimation Method", Proceedings of the 48th Symposium on Synthetic Crystals, 1A06, pp. 23-24, Nov. 4, 2003 (GNR May 8, 2007).

Imade et al. "Growth of Thick GaN Films with High Growth Rate Using Sublimation Method under High Pressure", Jpn. J. Appl. Phys., vol. 43 (2004), pp. L486-L488.

* cited by examiner

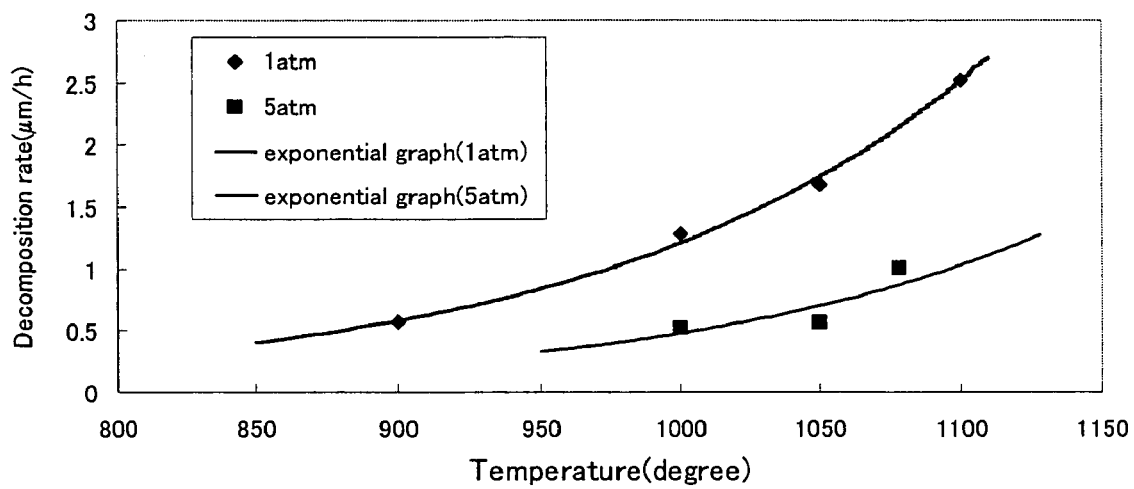
F I G. 37
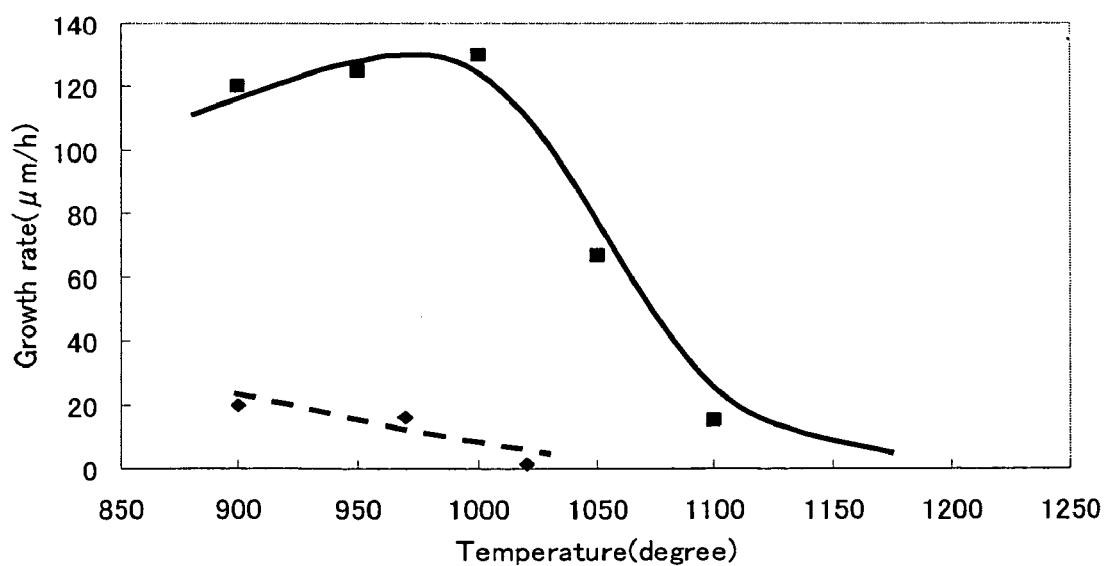
F I G. 38

METHOD OF MANUFACTURING GROUP III NITRIDE SINGLE CRYSTAL, DEVICE USED FOR THE METHOD AND GROUP III NITRIDE SINGLE CRYSTAL OBTAINED BY THE METHOD

BACKGROUND OF THE INVENTION

1. Field of the Invention

The present invention relates to a method of manufacturing a Group III nitride single crystal, a device used for the method, and a Group III nitride single crystal obtained by the method.

2. Related Background Art

A Group III nitride semiconductor has been used, e.g., in the field of heterojunction high-speed electron devices or photoelectron devices (such as a semiconductor laser, light emitting diode, and sensor). In particular, gallium nitride (GaN) has attracted considerable attention. As a conventional method of producing a gallium nitride single crystal, a so-called sublimation method has been employed (see, e.g., Jpn. J. Appl. Phys., Vol. 36, L184-L186, 1997 and Journal of Crystal Growth, 237-239 (2002) 922-925). In the sublimation method, gallium nitride powder is heated and sublimed at about 1000° C., and then is cooled and recrystallized, thereby growing a gallium nitride single crystal. In this method, however, while the gallium nitride single crystal is grown, the grown gallium nitride is decomposed due to heating. Therefore, the conventional method has the disadvantage of low production efficiency. This is a problem not only for the GaN single crystal, but also for AlN or InN single crystals.

Therefore, with the foregoing in mind, it is an object of the present invention to provide a method of manufacturing a Group III nitride single crystal that can suppress decomposition during the crystal growth and provide efficient manufacture.

SUMMARY OF THE INVENTION

A method of manufacturing a Group III nitride single crystal of the present invention includes heating a material for the Group III nitride single crystal so that the material is sublimed or evaporated into an aeriform substance and crystallizing the aeriform substance to grow a single crystal. The single crystal is grown under pressure.

In the manufacturing method of the present invention, the single crystal is grown under pressure, so that decomposition of the grown single crystal can be suppressed. Therefore, it is possible to achieve a higher growth rate and improved crystallinity. Moreover, the manufacturing method of the present invention allows the growth of the single crystal to be oriented in a predetermined direction. For a GaN single crystal, e.g., it is desirable that the orientation is aligned in the horizontal direction with the c-axis (0001) perpendicular to a substrate.

BRIEF DESCRIPTION OF THE DRAWINGS

FIG. 37 is a graph showing an example of the relationship between a substrate temperature and a decomposition rate.

FIG. 38 is a graph showing an example of the relationship between a substrate temperature and a growth rate.

DETAILED DESCRIPTION OF THE INVENTION

Figure 1:
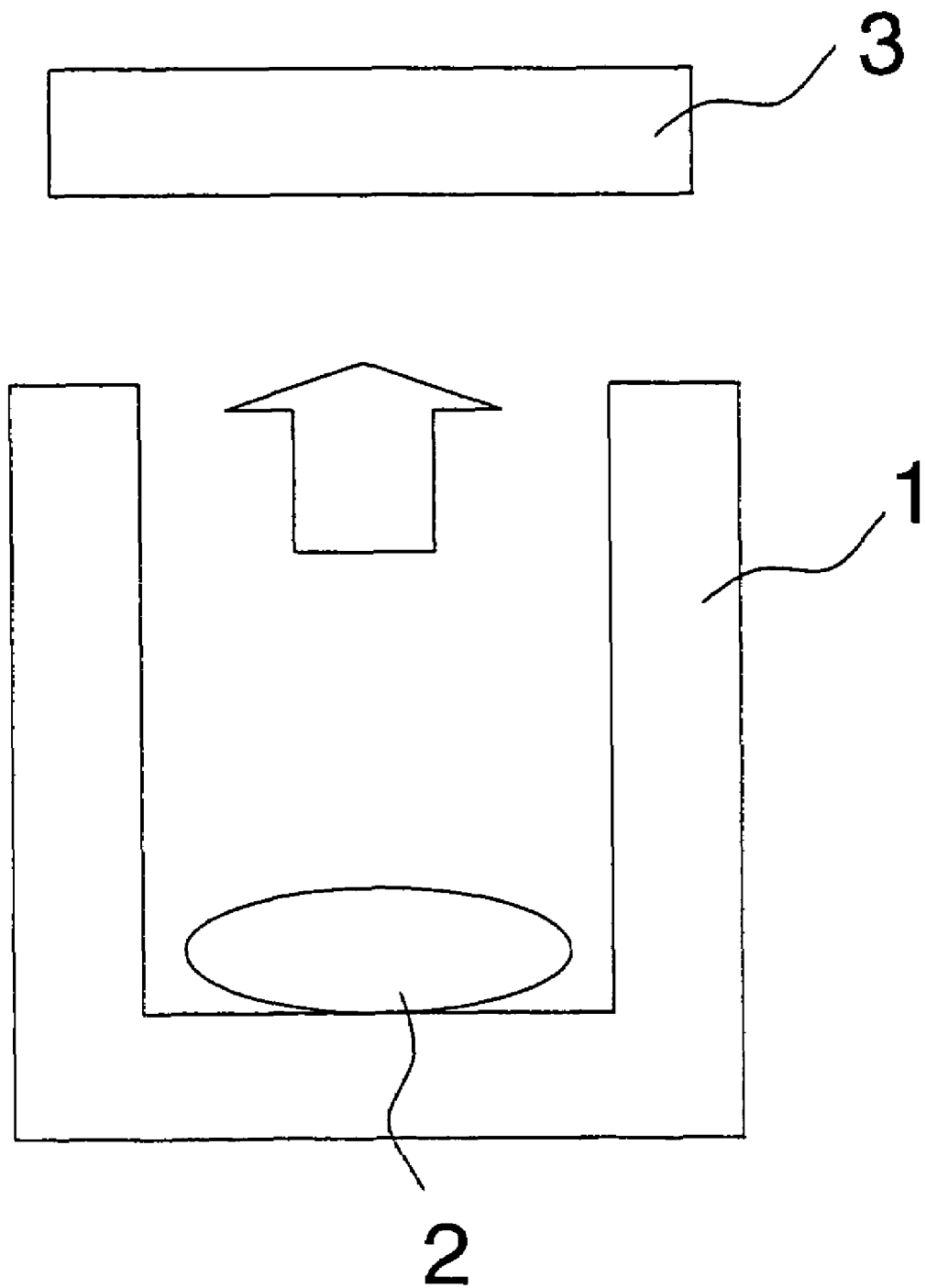
FIG. 1 is a schematic diagram showing an example of the configuration of a device used for a manufacturing method of the present invention.

In the present invention, the Group III element may be Ga, Al, and In. Examples of the Group III nitride include GaN, AlN, and InN. In particular, GaN is preferred.

In the present invention, the material is not particularly limited, and may be, e.g., GaN powder, AlN powder, InN powder, Ga, Al, or In. In particular, GaN powder, AlN powder, and InN powder are preferred. For example, when GaN powder is used, the surface area of the material becomes larger compared with Ga (metal), and the amount of decomposition (evaporation) of the material can be increased. It is preferable that sublimation or evaporation of the material is performed continuously by adding the material during the process of growing a single crystal.

In the manufacturing method of the present invention, it is preferable that the aeriform substance is produced by heating and subliming the material, and the crystallization is performed by cooling the aeriform substance. Alternatively, the crystallization may be performed by allowing the aeriform substance and a reactive gas to react with each other.

In the manufacturing method of the present invention, it is preferable that the aeriform substance is supplied to a crystal generation region by a carrier gas, and the single crystal is grown in the crystal generation region.

In the manufacturing method of the present invention, it is preferable that a temperature ($T1(°C.)$) of the material and a temperature ($T2(°C.)$) of the crystal generation region are controlled independently while satisfying $T1>T2$. $T1$ (° C.) may be, e.g., in the range of 300° C. to 2600° C., preferably 900° C. to 2000° C., and more preferably 1000° C. to 1400° C. $T2$ (° C.) may be, e.g., in the range of 300° C. to 2600° C., preferably 500° C. to 1600° C., and more preferably 800° C. to 1400° C. A difference between $T1$ and $T2$ may be, e.g., in the range of 5° C. to 2000° C., preferably 10° C. to 1000° C., and more preferably 10° C. to 500° C.

In the manufacturing method of the present invention, it is preferable that the aeriform substance is produced by heating and evaporating the material, and the crystallization is performed by allowing the aeriform substance and a reactive gas to react with each other. Moreover, it is preferable that the aeriform substance is produced by heating, decomposing and evaporating the material.

It is preferable that part or all of the aeriform substance is, e.g., $GaH_x$, $AlH_x$, $InH_x$, $GaN_xH$, $AlN_xH$, or $InN_xH$.

In the present invention, the carrier gas may be, e.g., a $N_2$ gas, inert gas (such as Ar, He, and Ne), or hydrogen gas. They may be used individually, or two or more of them may be used together. The carrier gas can be introduced, e.g., in such a manner that it flows from the lower portion of a material supply region, which will be described later, to the crystal generation region. The flow rate of the carrier gas may be, e.g., in the range of 50 sccm to 20000 sccm (${50 \times 1.01325 \times 10^5}$ $(Pa) \times 10^{-6}$ $(m^3)$}/60(sec) to ${20000 \times 1.01325 \times 10^5 (Pa) \times 10^{-6} (m^3)}/60(sec))$, preferably 100 sccm to 10000 sccm (${100 \times 1.01325 \times 10^5 (Pa) \times 10^{-6} (m^3)}/60(sec)$ to ${10000 \times 1.01325 \times 10^5 (Pa) \times 10^{-6} (m^3)}/60(sec))$, and more preferably 200 sccm to 5000 sccm (${200 \times 1.01325 \times 10^5 (Pa) \times 10^{-6} (m^3)}/60(sec)$ to ${5000 \times 1.01325 \times 10^5 (Pa) \times 10^{-6} (m^3)}/60(sec))$. The amount of material supplied by the carrier gas to the crystal generation region per hour may be, e.g., in the range of 0.001 mol/h to 1 mol/h, and preferably 0.005 mol/h to 0.1 mol/h.

In the present invention, it is preferable that the single crystal is grown in an atmosphere of a nitrogen (N) containing gas. The nitrogen (N) containing gas that serves as an ambient gas may be, e.g., a nitrogen ($N_2$) gas or $NH_3$ gas. In this case, the $NH_3$ gas and a mixed gas containing $N_2$ and $NH_3$ are preferred. When the material is heated and sublimed, the mixed gas containing $N_2$ and $NH_3$ is suitable for the nitrogen (N) containing gas. When the material is heated and evaporated or when the material is heated, decomposed, and evaporated, at least one of the $N_2$ gas and the inert gas is suitable for the nitrogen (N) containing gas. When the $NH_3$ gas is used, the ratio of the $NH_3$ gas preferably is controlled, e.g., by mixing a $N_2$ gas, inert gas (such as Ar, He, and Ne), and $H_2$ gas. When the mixed gas containing $N_2$ and $NH_3$ is used, the mixing ratio (volume ratio) may be, e.g., $N_2:NH_3=95$ to 40:5 to 60, preferably 90 to 60:10 to 40, and more preferably 85 to 70:15 to 30.

In the present invention, the reactive gas preferably includes at least a $NH_3$ gas and further includes, e.g., an inert gas or $H_2$ gas. Even if the material is heated and sublimed, nitrogen (N) contained in the reactive gas may react with the aeriform substance. The flow rate of the reactive gas may be, e.g., in the range of 30 sccm to 3000 sccm (${30 \times 1.01325 \times 10^5 (Pa) \times 10^{-6} (m^3)}/60(sec)$ to ${3000 \times 1.01325 \times 10^5 (Pa) \times 10^{-6} (m^3)}/60(sec))$, preferably 50 sccm to 1000 sccm (${50 \times 1.01325 \times 10^5 (Pa) \times 10^{-6} (m^3)}/60(sec)$ to ${1000 \times 1.01325 \times 10^5 (Pa) \times 10^{-6} (m^3)}/60(sec))$, and more preferably 100 sccm to 500 sccm (${100 \times 1.01325 \times 10^5 (Pa) \times 10^{-6} (m^3)}/60(sec)$ to ${500 \times 1.01325 \times 10^5 (Pa) \times 10^{-6} (m^3)}/60(sec))$.

In the present invention, the pressure may be, e.g., more than 1 atm and not more than 10000 atm (more than $1 \times 1.013 \times 10^5$ Pa and not more than $10000 \times 1.013 \times 10^5$ Pa), preferably in the range of 3 atm to 1000 atm ($3 \times 1.013 \times 10^5$ Pa to $1000 \times 1.013 \times 10^5$ Pa), and more preferably 10 atm to 500 atm ($10 \times 1.013 \times 10^5$ Pa to $500 \times 1.013 \times 10^5$ Pa).

In the present invention, the material may be heated, e.g., at 300° C. to 2400° C. To produce a GaN single crystal, e.g., the material may be heated preferably at 800° C. to 1500° C., and more preferably at 1000° C. to 1400° C.

In the present invention, the nitrogen (N) containing gas preferably includes impurities so that the impurities are introduced into the Group III nitride single crystal. Examples of the impurities include silicon (Si), alumina ($Al_2O_3$), indium (In), aluminum (Al), indium nitride (InN), silicon oxide ($SiO_2$), indium oxide ($In_2O_3$), zinc (Zn), magnesium (Mg), zinc oxide (ZnO), magnesium oxide (MgO), and germanium (Ge).

In the present invention, it is preferable that a Group III nitride is prepared beforehand as a nucleus of crystal growth, and the single crystal is grown on the surface of the nucleus.

In the present invention, the Group III nitride that serves as a nucleus may be either a single crystal or amorphous. The single crystal used as a nucleus may be in any form, and preferably, e.g., in the form of a thin film. This thin film may be formed on a substrate. Examples of a material for the substrate include amorphous gallium nitride (GaN), amorphous aluminum nitride (AlN), sapphire, silicon (Si), gallium arsenide (GaAs), gallium nitride (GaN), aluminum nitride (AlN), silicon carbide (SiC), boron nitride (BN), lithium gallium oxide (LiGaO$_2$), zirconium diboride (ZrB$_2$), zinc oxide (ZnO), various types of glass, various types of metal, boron phosphide (BP), MoS$_2$, LaAlO$_3$, NbN, MnFe$_2$O$_4$, ZnFe$_2$O$_4$, ZrN, TiN, gallium phosphide (GaP), MgAl$_2$O$_4$, NdGaO$_3$, LiAlO$_2$, ScAlMgO$_4$, and Ca$_8$La$_2$(PO$_4$)$_6$O$_2$. Above all, a thin film of Group III nitride is preferred. The thickness of the thin film used as a nucleus is not particularly limited, and may be, e.g., in the range of 0.0005 μm to 100000 μm, preferably 0.001 μm to 50000 μm, and more preferably 0.01 μm to 5000 μm. The thin film of Group III nitride single crystal can be formed on the substrate, e.g., by metal organic chemical vapor deposition (MOCVD), hydrid vapor phase epitaxy (HVPE), or molecular beam epitaxy (MBE). Moreover, a substrate on which a gallium nitride thin film is formed is commercially available and may be used in the present invention. The maximum diameter of the thin film may be, e.g., not less than 2 cm, preferably not less than 3 cm, and more preferably not less than 5 cm. A larger maximum diameter is preferred, and thus there is no upper limit of the maximum diameter. The standard of a bulk compound semiconductor is 2 inches. In view of this, the bulk compound semiconductor preferably has a maximum diameter of 5 cm. In such a case, the maximum diameter of the thin film may be, e.g., in the range of 2 cm to 5 cm, preferably 3 cm to 5 cm, and more preferably may be 5 cm. The maximum diameter is the longest line that joins two points on the perimeter of the thin film surface.

It is preferable that the reactive gas flows on the Group III nitride that is prepared in the crystal generation region as a nucleus. The reactive gas may flow either horizontally from the side of the Group III nitride or obliquely so as to make an angle with the substrate.

In the present invention, the single crystal may be grown directly on the surface of the substrate without forming the thin film.

In the present invention, the growth rate of the Group III nitride single crystal may be, e.g., not less than 100 μm/h, preferably not less than 500 μm/h, and more preferably not less than 1000 μm/h. The growth rate can be controlled, e.g., by increasing the pressure of an ambient gas, reducing the substrate temperature, or increasing the material temperature in the material supply region. The growth rate indicates the thickness of the Group III nitride single crystal grown per hour. In this case, the thickness of the Group III nitride single crystal is the average thickness of the crystal cross section measured by a scanning electron microscope (SEM).

A device for manufacturing a Group III nitride single crystal of the present invention is used for the manufacturing method of the present invention. The device includes a heating means for heating the material and a pressure application means for applying pressure to a growth atmosphere of the single crystal. The heating means may be, e.g., a typical heater. The pressure application means may be, e.g., a means for applying pressure by gas supply (such as a carrier gas, ambient gas, or reactive gas).

It is preferable that the device further includes a means for crystallizing the aeriform substance by allowing a reactive gas to flow on the aeriform substance. Moreover, it is preferable that the device further includes a material supply region and a crystal generation region, and that the heating means and a carrier gas introduction means are provided in the material supply region, and a reactive gas introduction means is provided in the crystal generation region.

In the device of the present invention, it is preferable that the material supply region and the crystal generation region are separated by a baffle. Such separation can prevent the movement of the material or Group III nitride from the crystal generation region to the material supply region, and thus efficiently reduce the generation of a Group III nitride single crystal in the crystal generation region.

Next, a Group III nitride single crystal of the present invention is provided by the manufacturing method of the present invention.

The full width at half maximum of the Group III nitride single crystal of the present invention may be, e.g., in the range of 10 sec to 1000 sec, and preferably 30 sec to 300 sec. The full width at half maximum can be determined, e.g., by ω scanning measurement with an X-ray analyzer.

A semiconductor device including the Group III nitride transparent single crystal of the present invention may be, e.g., a field-effect transistor, a light emitting diode (LED), a laser diode (LD), an optical sensor, or the like. However, the semiconductor device of the present invention is not limited thereto. Further examples of a semiconductor device using the single crystal of the present invention include the following: a semiconductor device that has a simple structure in which p-type and n-type semiconductors are only joined together and uses the single crystal of the present invention as the semiconductors (e.g., a pnp-type transistor, npn-type transistor, or npnp-type thyristor); and a semiconductor device that uses the single crystal of the present invention as an insulating layer, an insulating substrate, or an insulating semiconductor. The semiconductor device of the present invention can be manufactured by combining the manufacturing method of the present invention with a conventional method. For example, a GaN substrate may be formed by the manufacturing method of the present invention, on which a semiconductor layer may be formed by MOCVD or the like. Moreover, the manufacturing method of the present invention also can be used to form a semiconductor layer. Specifically, first an n-type GaN layer is formed in a nitrogen (N) containing gas atmosphere by the manufacturing method of the present invention. Then, a p-type GaN layer is formed on the n-type GaN layer in the same manner as described above except that the materials are changed. Thus, a pn junction semiconductor device can be provided. This method also can be applied to the manufacture of a field-effect transistor, LED, LD, semiconductor optical sensor, and other semiconductor devices. However, the semiconductor device of the present invention is not limited to the above manufacturing method, and can be manufactured by any other methods.

An example of the manufacturing method of the present invention will be described with reference to FIG. 1.

FIG. 1 shows an example of a manufacturing device used in the present invention. As shown in FIG. 1, a crucible 1 is arranged in a pressure- and heat-resistant reactor vessel (not shown), and a single crystal material (e.g., GaN powder or Ga metal) 2 is placed in the crucible 1. The crucible 1 is not particularly limited, and may be, e.g., a BN crucible, AlN crucible, alumina crucible, SiC crucible, graphite crucible, or crucible made of a carbon material such as diamond-like carbon. A substrate 3 is arranged above the crucible 1. The distance between the substrate 3 and the material 2 may be, e.g., in the range of 2 mm to 200 mm, preferably 3 mm to 50 mm, and more preferably 5 mm to 30 mm. While the crucible 1 is heated to about 1000° C., a mixed gas containing NH$_3$ and N$_2$ is introduced in the reactor vessel, and the pressure is kept at about 5 atm (5×1.013×10$^5$ Pa). The material 2 may be sublimed into a gas by heating. Alternatively, the material 2 may be decomposed and evaporated into a gas by heating. A single crystal grows on the surface of the substrate 3, e.g., in such a manner that the decomposed material reacts with a reactive gas, and then is crystallized on the surface, or that GaN is cooled and recrystallized on the surface. This crystal growth is performed under pressure, so that decomposition of the Group III nitride can be suppressed. Moreover, the single crystal can be grown to be oriented in a predetermined direction.

Figure 2A:
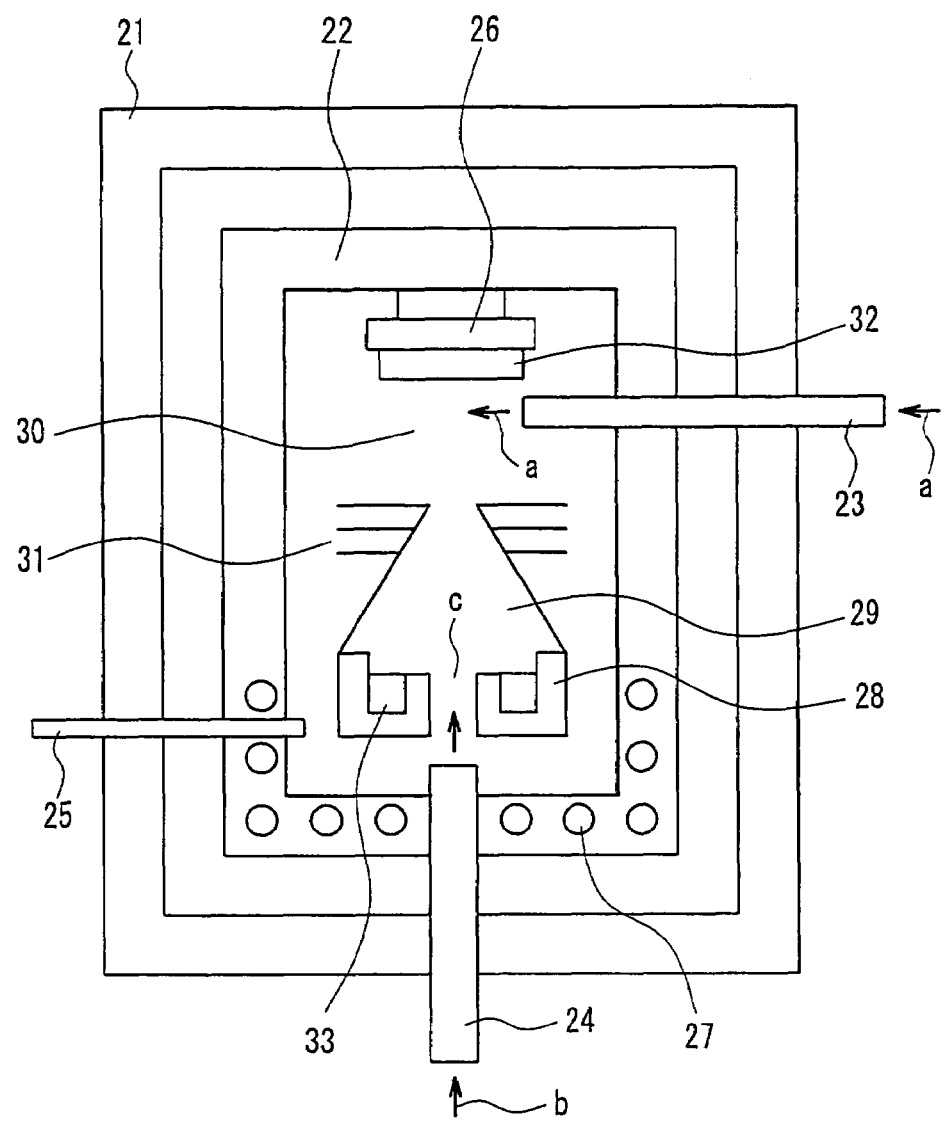
FIG. 2A is a schematic diagram showing an example of the configuration of a device used for a manufacturing method of the present invention.
Figure 2B:
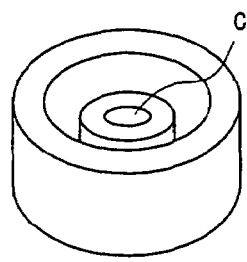
FIG. 2B is a perspective view showing an example of a crucible used for a manufacturing method of the present invention.

FIG. 2A shows another example of a manufacturing device of the present invention. As shown in FIG. 2A, the device includes a heating vessel 22 arranged in a pressure-resistant chamber 21, and a crucible 28 can be housed in the heating vessel 22. A heater 27 for heating a material is embedded in the wall of a lower portion of the heating vessel 22. A substrate 32 can be attached to the ceiling of the heating vessel 22 via a holder and a substrate heater 26. As shown in FIG. 2B, the crucible 28 has a through hole c in the center. When the crucible 28 is arranged in the heating vessel 22, a carrier gas inlet pipe 24 is inserted through the lower portions of the heating vessel 22 and the pressure-resistant chamber 21 and is positioned at the through hole c. A baffle 31 is arranged on the crucible 28 and separates a material supply region 29 from a crystal generation region 30. A reactive gas inlet pipe 23 is inserted through the side walls (in FIG. 2A, the side walls of the right upper portions) of the heating vessel 22 and the pressure-resistant chamber 21 so that the end of the reactive gas inlet pipe 23 is positioned in the vicinity of the surface of the substrate 32. In FIG. 2A, the reactive gas inlet pipe 23 is arranged horizontally. However, the reactive gas inlet pipe 23 may be arranged obliquely so as to make an angle with the substrate 32, thereby supplying the reactive gas directly to the substrate 32. This configuration is more preferred because it can ensure an efficient supply of the reactive gas to the substrate 32. A thermocouple 25 is inserted through the lower side walls (in FIG. 2A, the side walls of the left lower portions) of the heating vessel 22 and the pressure-resistance chamber 21.

The method of manufacturing a Group III nitride single crystal using this device will be described by taking a GaN single crystal as an example. First, the substrate 32 (e.g., a sapphire substrate, a nitride semiconductor substrate, or the like) is attached to the substrate heater 26. Then, a crystal material 33 such as GaN powder is placed in the crucible 28, and the crucible 28 is located at a predetermined position in the heating vessel 22. Under these conditions, the crucible 28 is heated (e.g., at 1000° C.) by the heater 27. At the same time, a carrier gas (indicated by the arrow b in FIG. 2A) flows from the inlet pipe 24 to the substrate 32 through the through hole c of the crucible 28, and a reactive gas (an ammonia (NH$_3$) containing gas, indicated by the arrow a in FIG. 2A) flows from the inlet pipe 23 to the vicinity of the surface of the substrate 32. Thus, the material is allowed to react with nitrogen (N) contained in the reactive gas. The inside of the heating vessel 22 is under pressure (about 5 atm (5×1.013×10$^5$ Pa)).

The GaN powder is decomposed into Ga and N by heat, as expressed by the following formula (1). However, when the ambient gas, the carrier gas, and the reactive gas contain hydrogen (H$_2$), GaN is decomposed to yield Ga, and the Ga reacts with the hydrogen (H$_2$) to produce, e.g., GaH$_x$ or GaN$_x$H, as expressed by the following formulas (3) and (4). This is because the activation energy of GaH$_x$ is smaller than that of Ga. These substances act as an intermediate product and can accelerate the decomposition reaction and evaporation process of the material. Even if Ga metal is used as the material, e.g., GaH$_x$ or the like is produced, as expressed by the following formula (4).

The carrier gas allows Ga or the intermediate product to flow from the material supply region 29 to the crystal generation region 30 in the vicinity of the surface of the substrate 32, where Ga or the intermediate product reacts with radical nitrogen that is generated by the decomposition of ammonia (NH$_3$) in the reactive gas, and thus is crystallized and deposited on the surface of the substrate 32, resulting in growth of a GaN single crystal. The reaction of Ga obtained by decomposition and ammonia (NH$_3$) in the reactive gas is expressed by the following formula (2). The reaction of GaH$_x$ and ammonia (NH$_3$) in the reactive gas is expressed by the following formula (5).

$$GaN \rightarrow Ga+(1/2)N_2 \qquad (1)$$

$$Ga+NH_3 \rightarrow GaN+(3/2)H_2 \qquad (2)$$

$$GaN+(3/2)H_2 \rightarrow Ga+NH_3 \qquad (3)$$

$$Ga+(x/2)H_2 \rightarrow GaH_x \qquad (4)$$

$$GaH_x+NH_3 \rightarrow GaN+((3+x)/2)H_2 \qquad (5)$$

It is preferable that a GaN thin film is formed on the surface of the substrate 32 before the growth of a GaN single crystal, e.g., by MOCVD or HVPE.

The Group III nitride single crystal of the present invention can be produced in the manner as described above. However, a method other than the manufacturing method of the present invention also may be used to produce the Group III nitride single crystal of the present invention.

Next, examples of the present invention will be described, together with comparative examples. In each of the examples and comparative examples, a sublimation method includes the following: a method in which a material is heated, sublimed, cooled, and recrystallized; a method in which a material is heated, decomposed and evaporated, allowed to react with a reactive gas, and crystallized; and a method in which a material is heated, evaporated, allowed to react with a reactive gas, and crystallized.

EXAMPLES

Examples 1-1 to 1-7

As shown in FIG. 1, a crucible 1 was arranged in a pressure- and heat-resistant reactor vessel (not shown), and a single crystal material (GaN powder) 2 was placed in the crucible 1. A substrate 3 was arranged above the crucible 1. While the crucible 1 was heated, a mixed gas containing NH$_3$ and N$_2$ was introduced into the reactor vessel, the pressure was increased to 5 atm (5×1.013×10$^5$ Pa), and a gallium nitride single crystal was grown on the surface of the substrate 3 by sublimation. The growth conditions were as follows: the amount of GaN powder material was 2 g; the distance between the substrate and the material was 140 mm; the substrate material was sapphire; and the NH$_3$ flow rate (10% NH$_3$ gas) was 50 sccm ({50×1.01325×10$^5$ (Pa)× 10$^{-6}$ (m$^3$)}/60(sec)). In Examples 1-1 to 1-4, single crystal growth was performed by changing the growth temperature in the range of 1000° C. to 1110° C., as shown in Table 1. In Examples 1-5 to 1-7, the gallium nitride single crystal was grown by maintaining the growth temperature constant (1000° C.) and changing the NH$_3$ gas concentration and the flow rate, as shown in Table 2.

Figure 3:
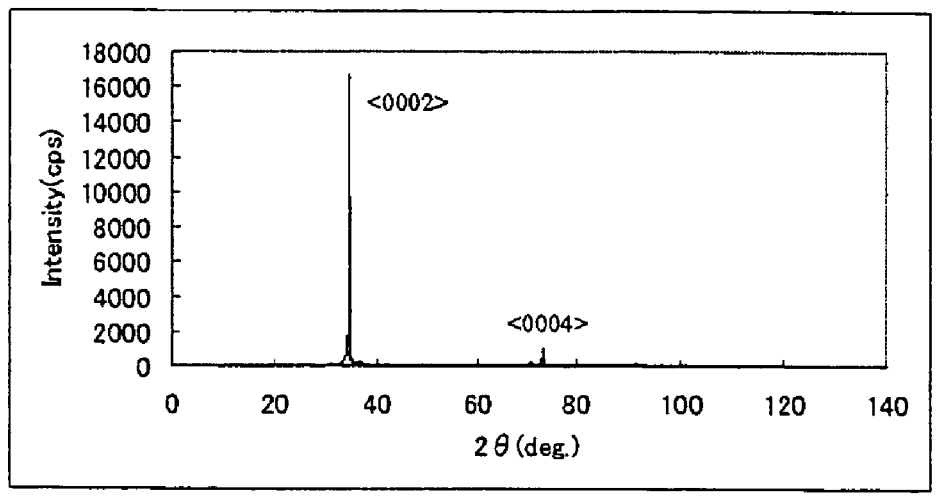
FIG. 3 is a graph showing XRD measurement in Example 1-1 of the present invention.
Figure 4:
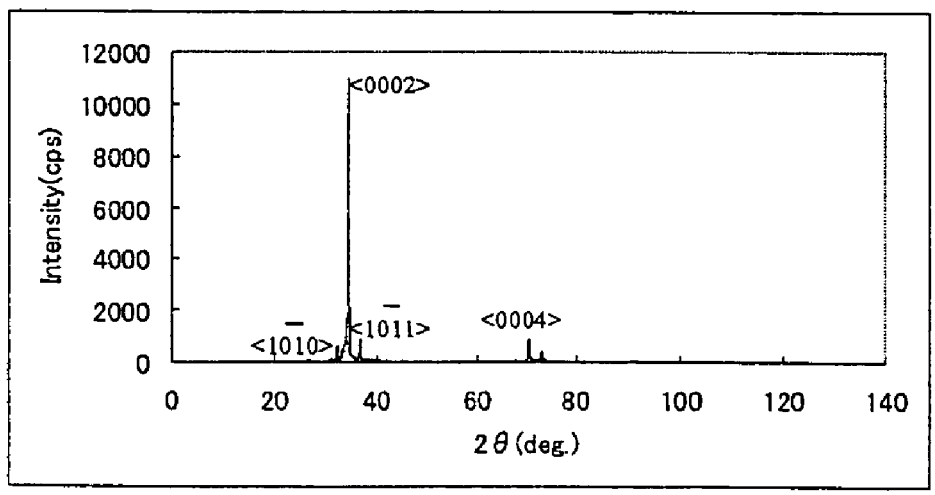
FIG. 4 is a graph showing XRD measurement in Example 1-2 of the present invention.
Figure 5:
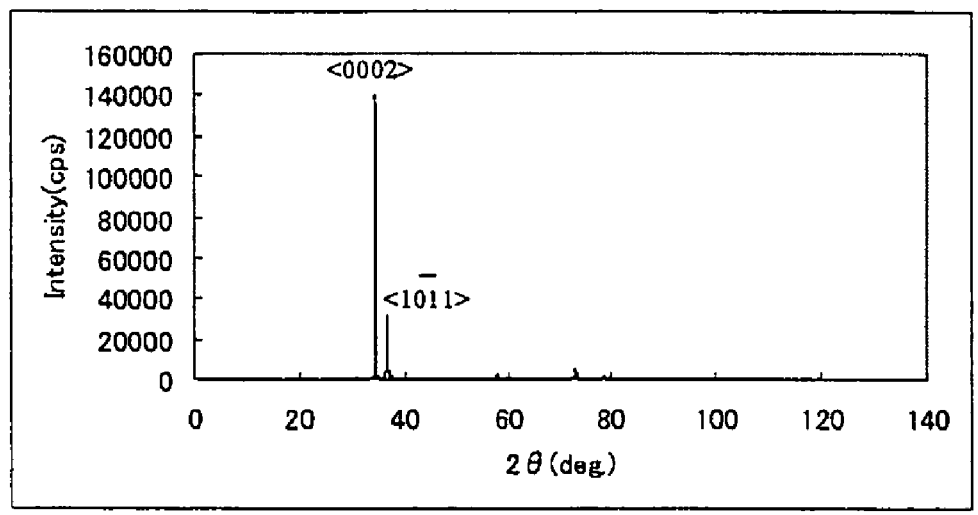
FIG. 5 is a graph showing XRD measurement in Example 1-3 of the present invention.
Figure 6:
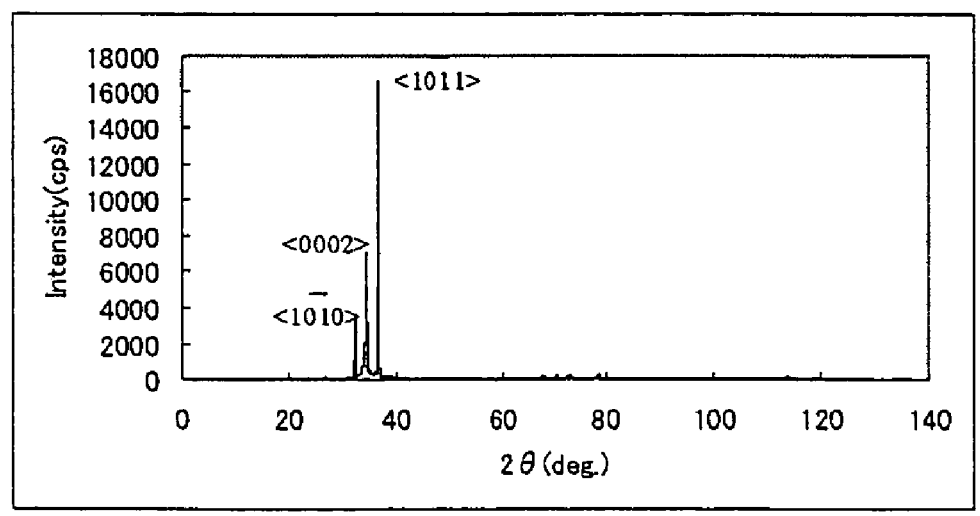
FIG. 6 is a graph showing XRD measurement in Example 1-4 of the present invention.
Figure 7:
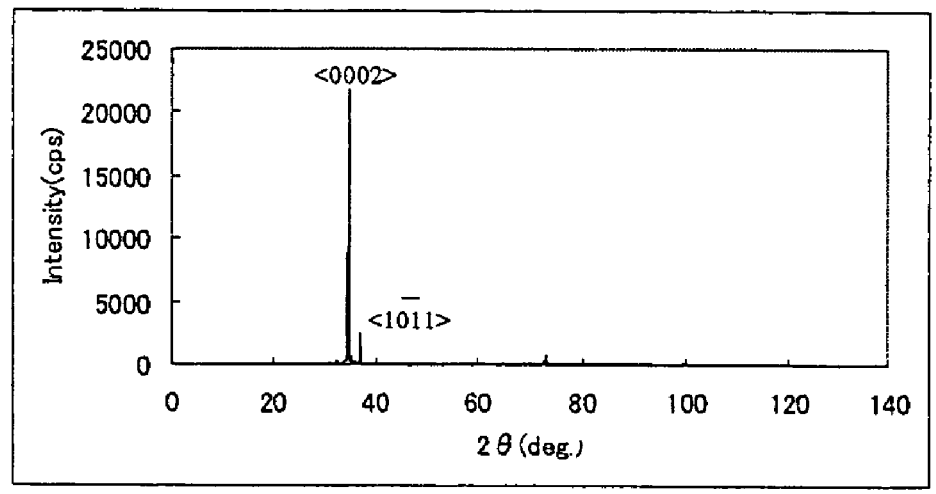
FIG. 7 is a graph showing XRD measurement in Example 1-5 of the present invention.
Figure 8:
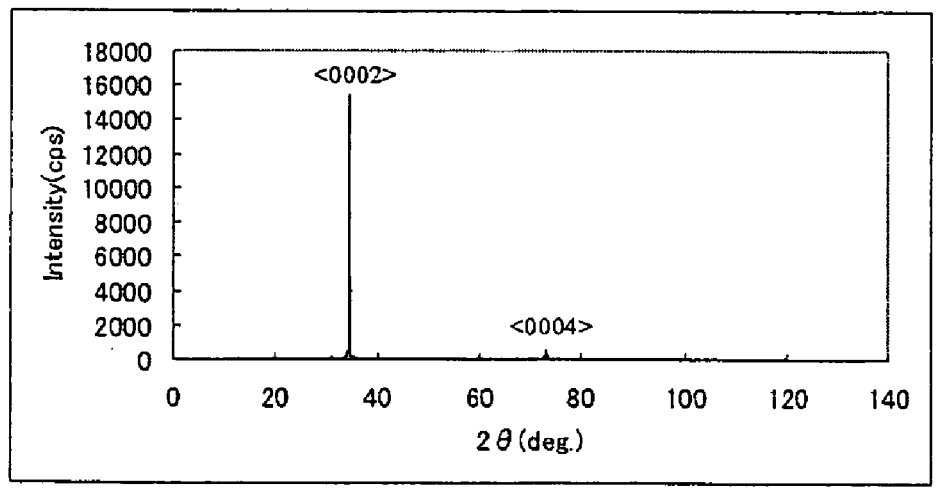
FIG. 8 is a graph showing XRD measurement in Example 1-6 of the present invention.
Figure 9:
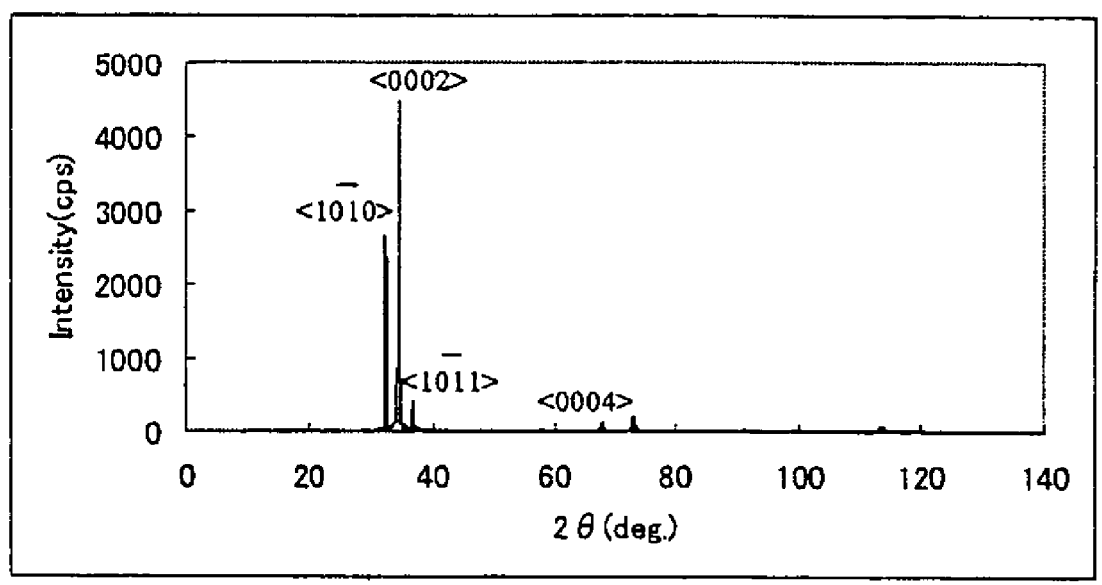
FIG. 9 is a graph showing XRD measurement in Example 1-7 of the present invention.
Figure 10:
FIG. 10 is a SEM photograph (the SEM image of a crystal surface) in Example 1-1 of the present invention.
Figure 11:
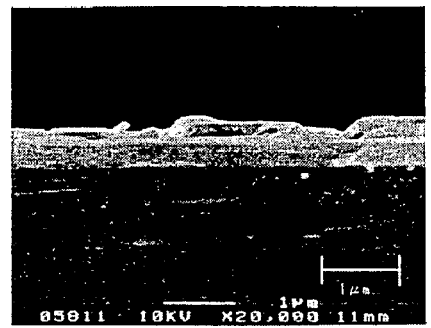
FIG. 11 is a SEM photograph (the SEM image of a crystal cross section) in Example 1-1 of the present invention.
Figure 12:
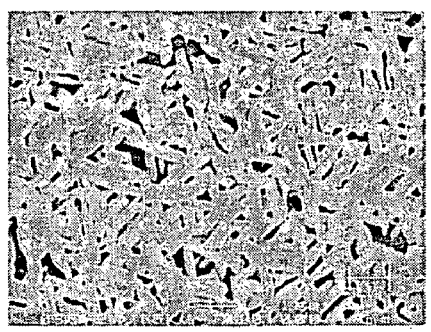
FIG. 12 is a SEM photograph (the SEM image of a crystal surface) in Example 1-2 of the present invention.
Figure 13:
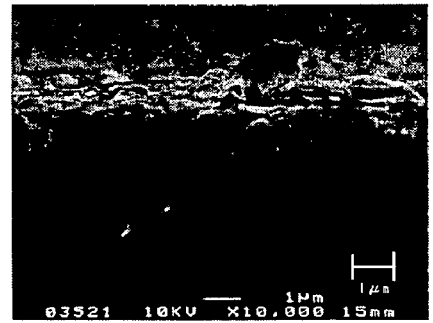
FIG. 13 is a SEM photograph (the SEM image of a crystal cross section) in Example 1-2 of the present invention.
Figure 14:
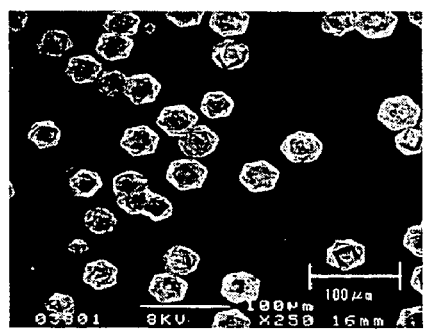
FIG. 14 is a SEM photograph (the SEM image of a crystal surface) in Example 1-3 of the present invention.
Figure 15:
FIG. 15 is a SEM photograph (the SEM image of a crystal cross section) in Example 1-3 of the present invention.
Figure 16:
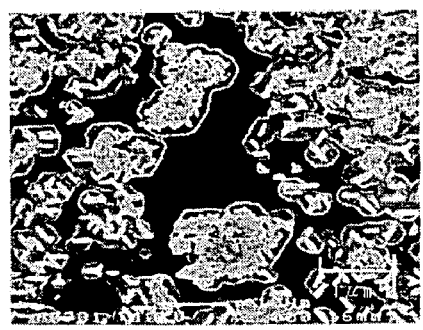
FIG. 16 is a SEM photograph (the SEM image of a crystal surface) in Example 1-4 of the present invention.
Figure 17:
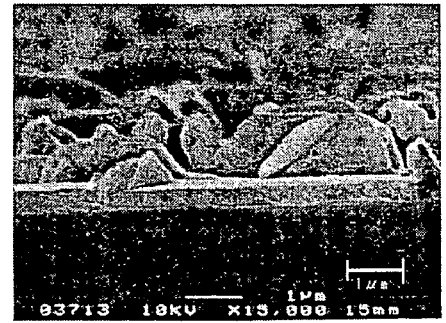
FIG. 17 is a SEM photograph (the SEM image of a crystal cross section) in Example 1-4 of the present invention.
Figure 18:
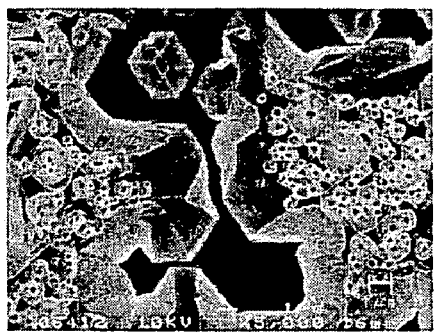
FIG. 18 is a SEM photograph (the SEM image of a crystal surface) in Example 1-5 of the present invention.
Figure 19:
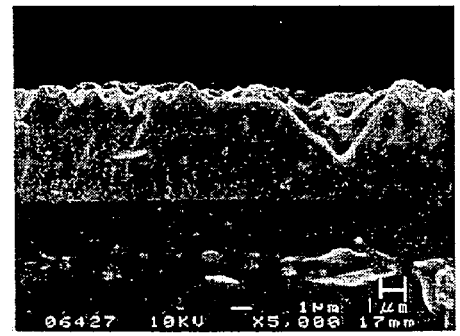
FIG. 19 is a SEM photograph (the SEM image of a crystal cross section) in Example 1-5 of the present invention.
Figure 20:
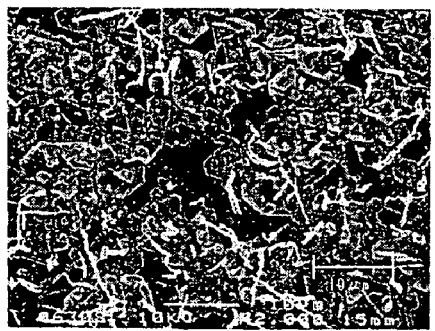
FIG. 20 is a SEM photograph (the SEM image of a crystal surface) in Example 1-6 of the present invention.
Figure 21:
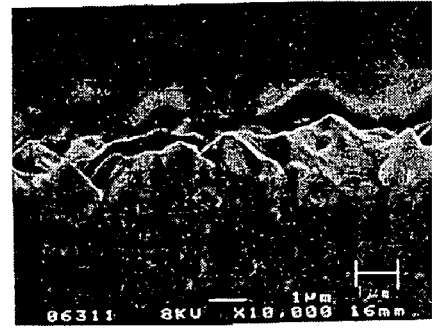
FIG. 21 is a SEM photograph (the SEM image of a crystal cross section) in Example 1-6 of the present invention.
Figure 22:
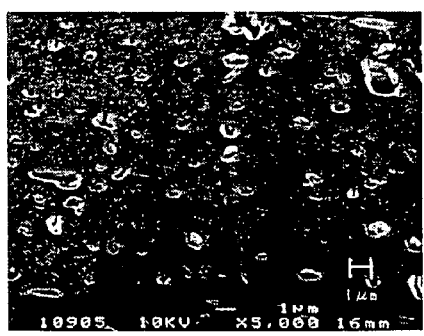
FIG. 22 is a SEM photograph (the SEM image of a crystal surface) in Example 1-7 of the present invention.
Figure 23:
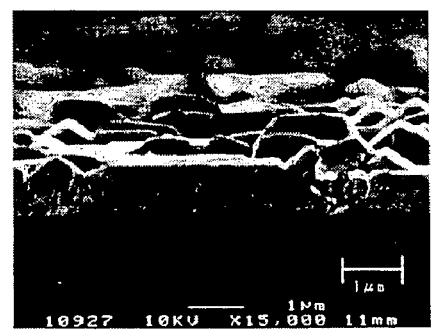
FIG. 23 is a SEM photograph (the SEM image of a crystal cross section) in Example 1-7 of the present invention.

The average thicknesses (average film thicknesses) of the gallium nitride single crystals thus produced in Examples 1-1 to 1-7 were determined by scanning electron microscope (SEM) observation. Tables 1 and 2 show the results. The SEM photographs of the single crystal in Example 1-1 are shown in FIG. 10 (the SEM image of the crystal surface) and FIG. 11 (the SEM image of the crystal cross section). The SEM photographs of the single crystal in Example 1-2 are shown in FIG. 12 (the SEM image of the crystal surface) and FIG. 13 (the SEM image of the crystal cross section). The SEM photographs of the single crystal in Example 1-3 are shown in FIG. 14 (the SEM image of the crystal surface) and FIG. 15 (the SEM image of the crystal cross section). The SEM photographs of the single crystal in Example 1-4 are shown in FIG. 16 (the SEM image of the crystal surface) and FIG. 17 (the SEM image of the crystal cross section). The SEM photographs of the single crystal in Example 1-5 are shown in FIG. 18 (the SEM image of the crystal surface) and FIG. 19 (the SEM image of the crystal cross section). The SEM photographs of the single crystal in Example 1-6 are shown in FIG. 20 (the SEM image of the crystal surface) and FIG. 21 (the SEM image of the crystal cross section). The SEM photographs of the single crystal in Example 1-7 are shown in FIG. 22 (the SEM image of the crystal surface) and FIG. 23 (the SEM image of the crystal cross section). Moreover, these single crystals also were measured by X-ray diffraction (XRD). FIG. 3 shows the XRD measurement of Example 1-1. FIG. 4 shows the XRD measurement of Example 1-2. FIG. 5 shows the XRD measurement of Example 1-3. FIG. 6 shows the XRD measurement of Example 1-4. FIG. 7 shows the XRD measurement of Example 1-5. FIG. 8 shows the XRD measurement of Example 1-6. FIG. 9 shows the XRD measurement of Example 1-7. In this case, the average film thickness of the single crystal was the average thickness of the crystal cross section measured by the SEM. The XRD measurement was performed in accordance with 2θ-ω scanning measurement using an X-ray analyzer.

TABLE 1

| Examples | Temperature (° C.) | Sublimation amount (g) | Average film thickness (μm) |
|---|---|---|---|
| 1-1 | 1000 | 0.153 | 0.684 |
| 1-2 | 1060 | 0.567 | 1.000 |
| 1-3 | 1070 | 1.044 | 6.900 |
| 1-4 | 1090 | 1.127 | 0.657 |

Gas supply: $NH_3$ 10% + $N_2$ 90%,
Flow rate: 50 sccm ({50 × 1.01325 × $10^5$ (Pa) × $10^{-6}$ ($m^3$)}/60(sec))

TABLE 2

| Examples | Gas mixing ratio | Gas flow rate (sccm) | Sublimation amount (g) | Average film thickness (μm) |
|---|---|---|---|---|
| 1-5 | $NH_3$ 10% + $N_2$ 90% | 140 | 0.716 | 7.000 |
| 1-6 | $NH_3$ 10% + $N_2$ 90% | 200 | 0.312 | 1.000 |
| 1-7 | $NH_3$ 25% + $N_2$ 75% | 50 | 0.430 | 0.700 |

Growth temperature: 1000° C.

The gas flow rate (sccm) in Table 2 can be expressed in terms of SI using the conversion formula of "{×1.01325×$10^5$ (Pa)×$10^{-6}$ ($m^3$)}/60(sec)".

As shown in Tables 1 and 2, the average film thickness of the single crystal was larger in Examples 1-1 to 1-7 than in Comparative examples 1-1 to 1-10, which will be described later. As indicated by the XRD measurements in FIGS. 3 to 9, the resultant single crystals were grown to be oriented in a predetermined direction. Particularly, the single crystal in Example 1-6 exhibited almost perfect c-axis orientation.

Comparative Examples 1-1 to 1-10

As shown in FIG. 1, a crucible 1 was arranged in a pressure- and heat-resistant reactor vessel (not shown), and a single crystal material (GaN powder) 2 was placed in the crucible 1. A substrate 3 was arranged above the crucible 1. While the crucible 1 was heated, a mixed gas containing $NH_3$ and $N_2$ was introduced into the reactor vessel, the pressure was under atmospheric pressure (i.e., no pressure was applied), and a gallium nitride single crystal was grown on the surface of the substrate 3 by sublimation. The growth conditions were as follows: the amount of GaN powder material was 2 g; the distance between the substrate and the material was 35 mm; the substrate material was sapphire; and the $NH_3$ flow rate (10% $NH_3$ gas) was 50 sccm ({50× 1.01325×$10^5$ (Pa)×$10^{-6}$ ($m^3$)}/60(sec)). In Comparative examples 1-1 to 1-6, this single crystal growth was performed by changing the growth temperature in the range of 1000° C. to 1110° C., as shown in Table 3. In Comparative examples 1-7 to 1-10, the gallium nitride single crystal was grown by maintaining the growth temperature constant (1000° C.) and changing the $NH_3$ gas concentration and the flow rate, as shown in Table 4.

Figure 24:
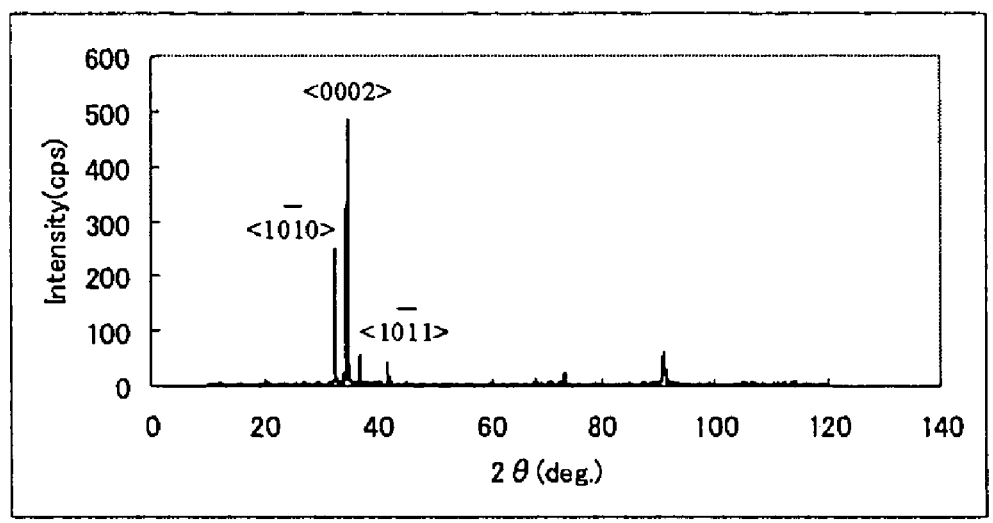
FIG. 24 is a graph showing XRD measurement in Comparative example 1-3.
Figure 25:
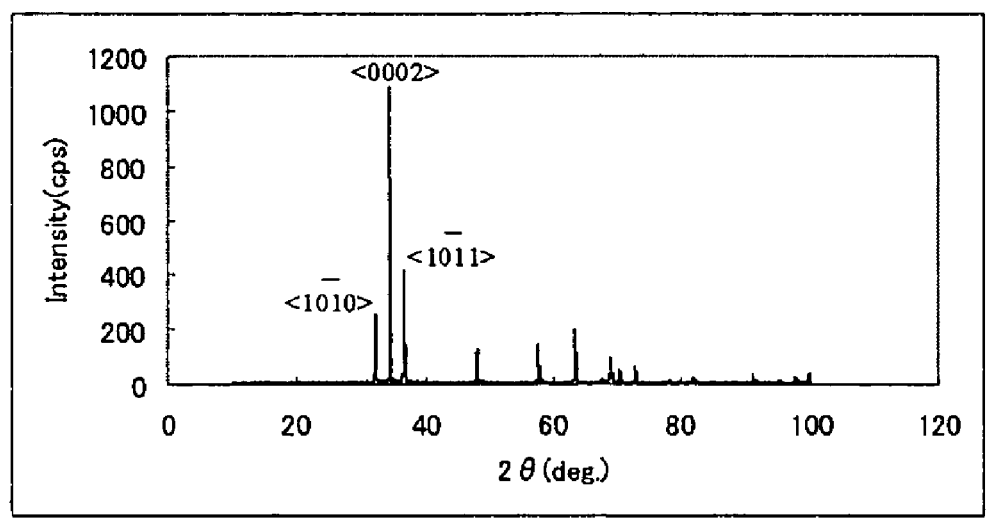
FIG. 25 is a graph showing XRD measurement in Comparative example 1-8.
Figure 26:
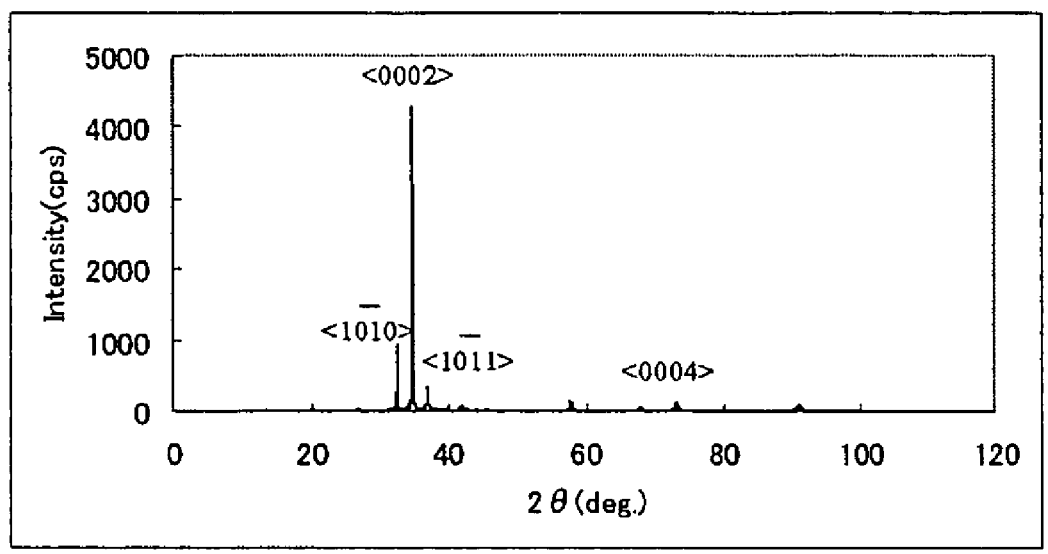
FIG. 26 is a graph showing XRD measurement in Comparative example 1-9.
Figure 27:
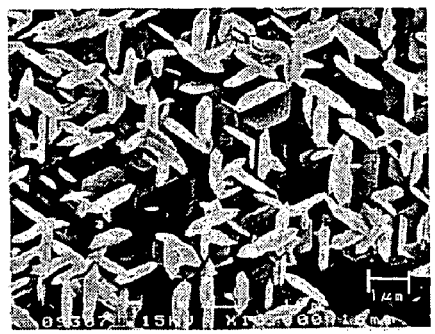
FIG. 27 is a SEM photograph (the SEM image of a crystal surface) in Comparative example 1-3.
Figure 28:
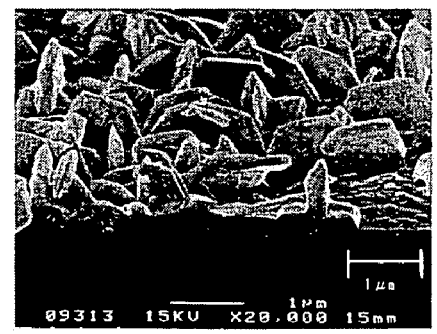
FIG. 28 is a SEM photograph (the SEM image of a crystal cross section) in Comparative example 1-3.
Figure 29:
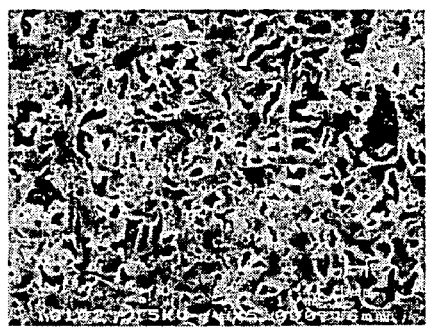
FIG. 29 is a SEM photograph (the SEM image of a crystal surface) in Comparative example 1-8.
Figure 30:
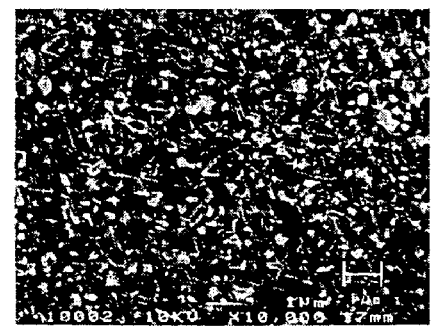
FIG. 30 is a SEM photograph (the SEM image of a crystal surface) in Comparative example 1-9.

Tables 3 and 4 show the results of growth (average film thickness) of the gallium nitride single crystals in Comparative examples 1-1 to 1-10. The average film thickness was measured in the same manner as Example 1. The SEM photographs of the single crystal in Comparative example 1-3 are shown in FIG. 27 (the SEM image of the crystal surface) and FIG. 28 (the SEM image of the crystal cross section). The SEM photograph of the single crystal in Comparative example 1-8 is shown in FIG. 29 (the SEM image of the crystal surface). The SEM photograph of the single crystal in Comparative example 1-9 is shown in FIG. 30 (the SEM image of the crystal surface). Like the Examples, the single crystals in Comparative examples 1-3, 1-8, and 1-9 were measured by XRD. FIG. 24 shows the XRD measurement of Comparative example 1-3. FIG. 25 shows the XRD measurement of Comparative example 1-8. FIG. 26 shows the XRD measurement of Comparative example 1-9.

TABLE 3

| Comparative examples | Temperature (° C.) | Sublimation amount (g) | Average film thickness (μm) |
|---|---|---|---|
| 1-1 | 950 | 0.052 | 0 |
| 1-2 | 980 | 0.335 | 0 |
| 1-3 | 1000 | 0.123 | 0.457 |
| 1-4 | 1020 | 0.300 | 0 |
| 1-5 | 1050 | 0.560 | 0 |
| 1-6 | 1100 | 1.283 | 0 |

Gas supply: $NH_3$ 10% + $N_2$ 90%,
Flow rate: 50 sccm ({50 × 1.01325 × $10^5$ (Pa) × $10^{-6}$ ($m^3$)}/60(sec))

TABLE 4

| Comparative examples | Gas mixing ratio | Gas flow rate (sccm) | Sublimation amount (g) | Average film thickness (μm) |
|---|---|---|---|---|
| 1-7 | $NH_3$ 10% + $N_2$ 90% | 50 | 0.123 | 0.457 |
| 1-8 | $NH_3$ 10% + $N_2$ 90% | 140 | 0.301 | * |
| 1-9 | $NH_3$ 10% + $N_2$ 90% | 200 | 0.277 | * |

TABLE 4-continued

| Comparative examples | Gas mixing ratio | Gas flow rate (sccm) | Sublimation amount (g) | Average film thickness (μm) |
|---|---|---|---|---|
| 1-10 | NH$_3$ 25% + N$_2$ 75% | 50 | 0.221 | 0 |

Growth temperature: 1000° C.
*unmeasurable

The gas flow rate (sccm) in Table 4 can be expressed in terms of SI using the conversion formula of "{×1.01325×10$^5$ (Pa)×10$^{-6}$ (m$^3$)}/60(sec)".

As shown in Tables 3 and 4, the growth of the single crystal was observed only in Comparative examples 1-3, 1-8, and 1-9. Although the thickness of the single crystal in Comparative examples 1-3 was largest in the comparative examples, it was even smaller than the average film thickness of every single crystal in Example 1. As indicated by the XRD measurements in FIGS. 24 to 26, the growth direction of the single crystals in the Comparative examples was random.

Examples 2-1 to 2-3

As shown in FIG. 2A, a crucible 28 was arranged in a pressure-resistant chamber 21, and a single crystal material (GaN powder) 33 was placed in the crucible 28. The growth conditions were as follows: the amount of GaN powder was 4 g; the distance between a substrate and the material was 140 mm; a carrier gas included 95% N$_2$ and 5% H$_2$, the flow rate of the carrier gas was 200 sccm ({200×1.01325×10$^5$ (Pa)×10$^{-6}$ (m$^3$)}/60(sec)); the material temperature was 1150° C.; an ambient gas included 100% N$_2$; a reactive gas included 100% NH$_3$, the flow rate of the reactive gas was 200 sccm ({200×1.01325×10$^5$ (Pa)×10$^{-6}$ (m$^3$)}/60(sec)); and the growth time was 30 min. The H$_2$ gas can accelerate the decomposition and evaporation of GaN. The ambient gas may include NH$_3$ as well as N$_2$, or may be an inert gas such as Ar. The reactive gas also may include N$_2$ or inert gas. Under these conditions, the pressure in the chamber 21 was increased to 5 atm (5×1.013×10$^5$ Pa), and a gallium nitride single crystal was grown at different substrate temperatures of 900° C. (Example 2-1), 1000° C. (Example 2-2), and 1100° C. (Example 2-3).

Comparative Examples 2-1 to 2-3

As Comparative examples 2-1 to 2-3, a gallium nitride single crystal was grown in the same manner as Example 2, except that the pressure in the chamber 21 was under atmospheric pressure (i.e., no pressure was applied), and the substrate temperature was 900° C. for Comparative example 2-1, 970° C. for Comparative example 2-2, and 1020° C. for Comparative example 2-3.

Figure 31:
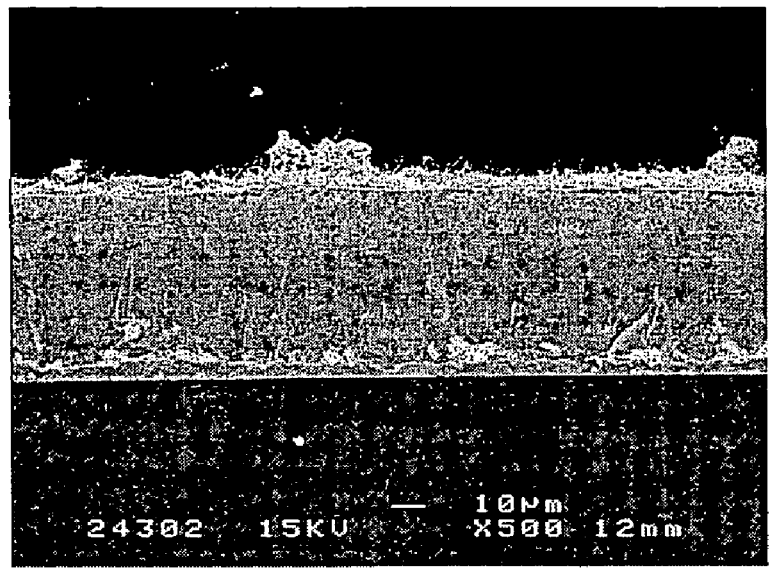
FIG. 31 is a SEM photograph (the SEM image of a crystal cross section) in Example 2-1 of the present invention.
Figure 32:
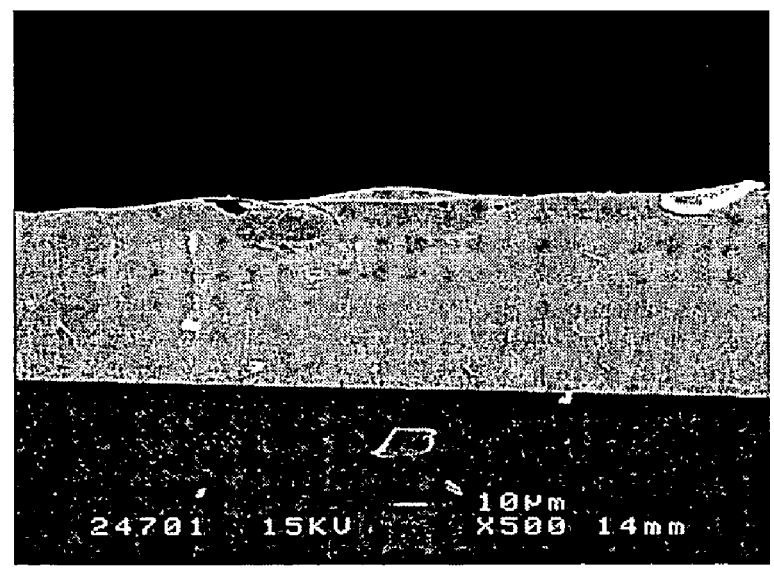
FIG. 32 is a SEM photograph (the SEM image of a crystal cross section) in Example 2-2 of the present invention.
Figure 33:
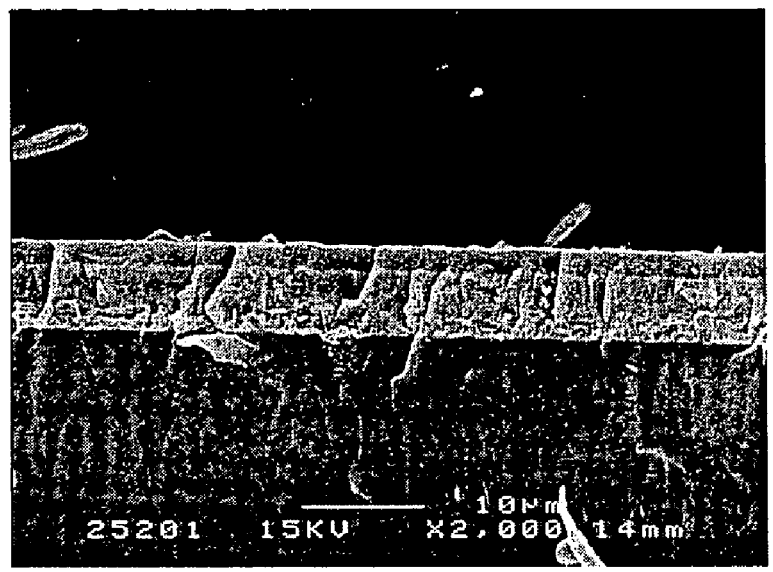
FIG. 33 is a SEM photograph (the SEM image of a crystal cross section) in Example 2-3 of the present invention.
Figure 34:
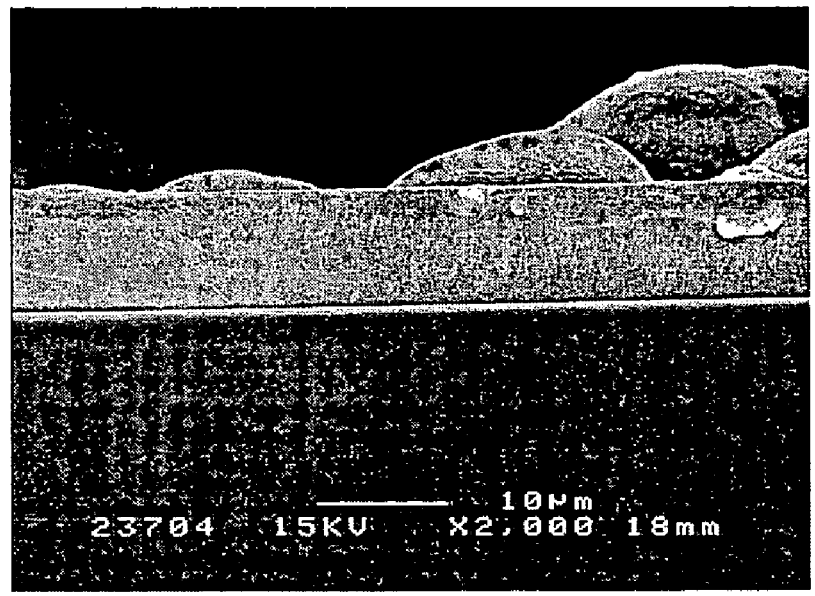
FIG. 34 is a SEM photograph (the SEM image of a crystal cross section) in Comparative example 2-1.
Figure 35:
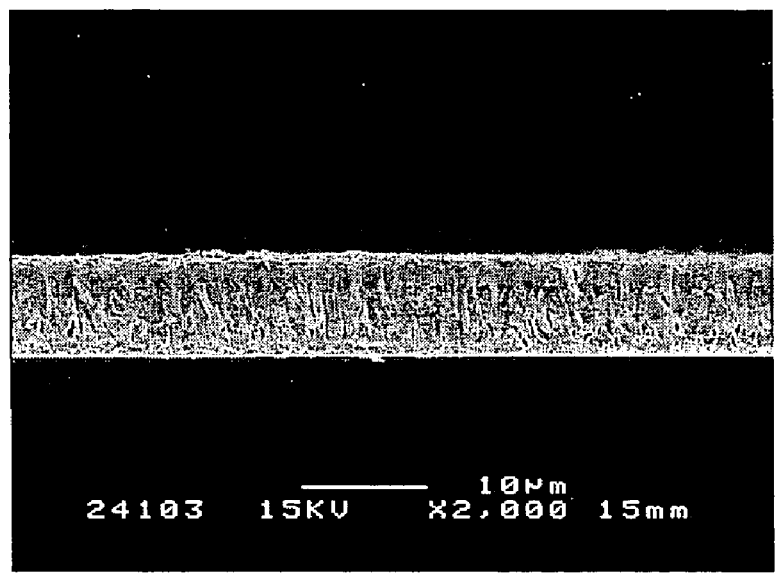
FIG. 35 is a SEM photograph (the SEM image of a crystal cross section) in Comparative example 2-2.
Figure 36:
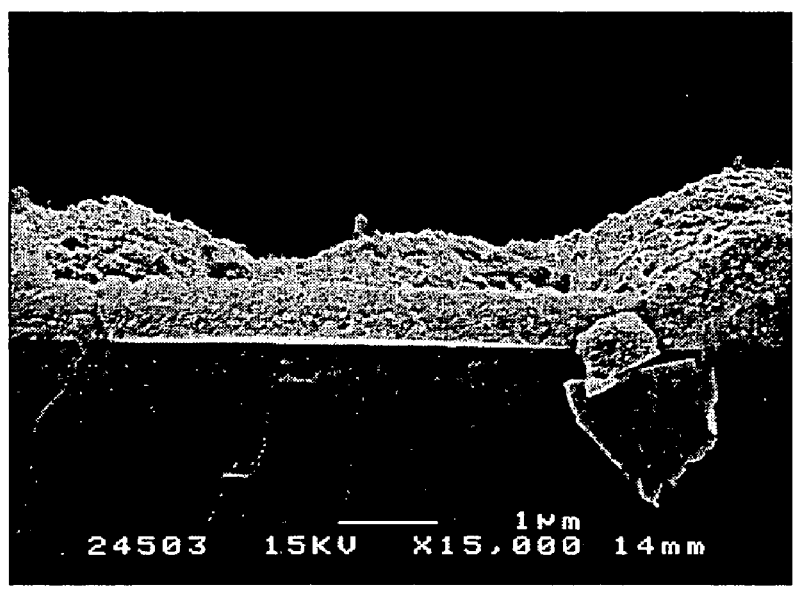
FIG. 36 is a SEM photograph (the SEM image of a crystal cross section) in Comparative example 2-3.

Table 5 shows the results of growth (average film thickness) of the gallium nitride single crystals in Examples 2-1 to 2-3 and Comparative examples 2-1 to 2-3. The average film thickness was measured in the same manner as Example 1. The SEM photograph of the single crystal in Example 2-1 is shown in FIG. 31 (the SEM image of the crystal cross section). The SEM photograph of the single crystal in Example 2-2 is shown in FIG. 32 (the SEM image of the crystal cross section). The SEM photograph of the single crystal in Example 2-3 is shown in FIG. 33 (the SEM image of the crystal cross section). The SEM photograph of the single crystal in Comparative example 2-1 is shown in FIG. 34 (the SEM image of the crystal cross section). The SEM photograph of the single crystal in Comparative example 2-2 is shown in FIG. 35 (the SEM image of the crystal cross section). The SEM photograph of the single crystal in Comparative example 2-3 is shown in FIG. 36 (the SEM image of the crystal cross section).

TABLE 5

|  |  | Temperature (° C.) | Average film thickness (μm) |
|---|---|---|---|
| Example | 2-1 | 900 | 60 |
|  | 2-2 | 1000 | 65 |
|  | 2-3 | 1100 | 10 |
| Comparative example | 2-1 | 900 | 10 |
|  | 2-2 | 970 | 10 |
|  | 2-3 | 1020 | 0.7 |

Gas supply: NH$_3$ 100%,
Flow rate: 200 sccm ({200 × 1.01325 × 10$^5$ (Pa) × 10$^{-6}$ (m$^3$)}/60(sec))

As shown in Table 5, although the thickness of the single crystals in Comparative examples 2-1 and 2-2 was the largest in the comparative examples, it was equal to or smaller than those of the single crystals in Examples 2-1, 2-2, and 2-3. The single crystal in Example 2-3 exhibited more excellent crystallinity than any other single crystal in the examples.

A GaN film that was formed on a sapphire substrate by MOCVD was heated at various temperatures under atmospheric pressure (i.e., no pressure was applied) or 5 atm (5×1.013×10$^5$ Pa) for 15 min, and the decomposition rate of GaN was estimated by a reduction in thickness of the GaN film. FIG. 37 shows the results. As can be seen from FIG. 37, the decomposition rate of GaN was reduced significantly in a pressure atmosphere (5 atm (5×1.013×10$^5$ Pa)).

FIG. 38 shows the relationship between the substrate temperature and the growth rate in both cases where a GaN single crystal was grown under atmospheric pressure (i.e., no pressure was applied) and where a GaN single crystal was grown at 5 atm (5×1.013×10$^5$ Pa). In a pressure atmosphere (5 atm (5×1.013×10$^5$ Pa)), the GaN single crystal had a maximum growth rate of 130 μm/h. The results demonstrate that crystal growth in a pressure atmosphere can suppress the decomposition of GaN on the substrate and provide a higher growth rate.

Figure 39:
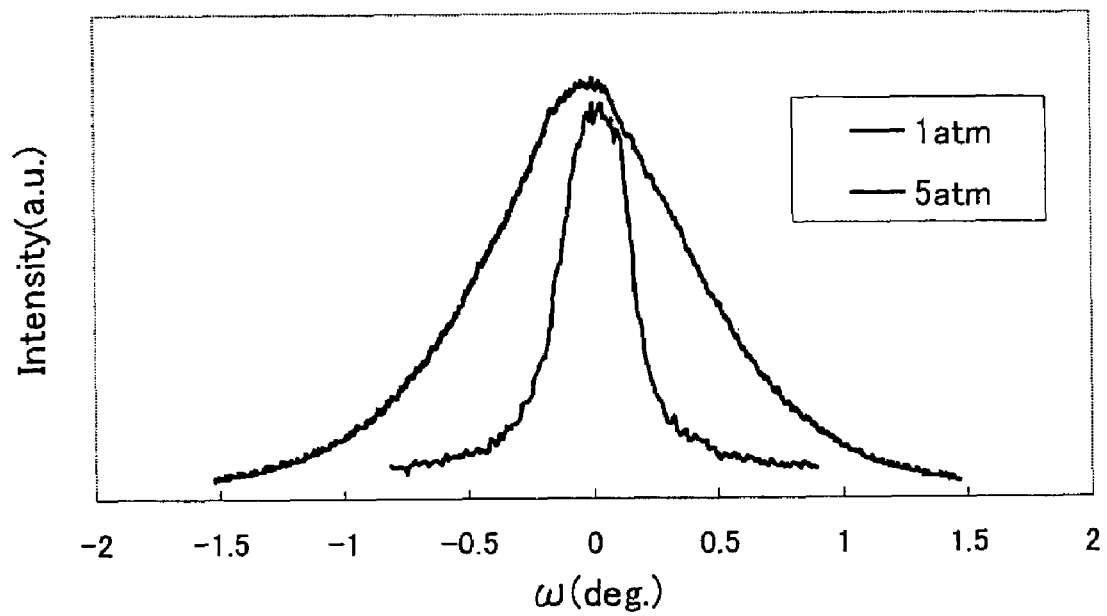
FIG. 39 is a graph showing an example of ω scanning measurement using an X-ray analyzer.

FIG. 39 shows ω scanning measurement using an X-ray analyzer. The GaN single crystal that was grown under atmospheric pressure (i.e., no pressure was applied) had a full width at half maximum of 3546 sec. In contrast, the GaN single crystal that was grown at 5 atm (5×1.013×10$^5$ Pa) had a full width at half maximum of 1155 sec. The results demonstrate that the GaN single crystal grown in a pressure atmosphere (5 atm (5×1.013×10$^5$ Pa)) also can improve crystallinity.

As described above, the manufacturing method of the present invention can provide a Group III nitride single crystal while suppressing decomposition during the crystal growth, and thus achieve excellent production efficiency. Moreover, the manufacturing method of the present invention allows the growth of the Group III nitride single crystal to be oriented in a predetermined direction, so that a high quality single crystal can be obtained.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of manufacturing a GaN single crystal comprising:
   growing a GaN single crystal by crystallizing an aeriform substance consisting essentially of $GaH_x$.

2. The method according to claim 1, wherein the single crystal is grown in an atmosphere of a nitrogen (N) containing gas.

3. The method according to claim 2, wherein the nitrogen (N) containing gas includes at least one selected from the group consisting of $NH_3$, $N_2$, and inert gas.

4. The method according to claim 1, wherein the material is at least one selected from the group consisting of Ga and GaN powder.

5. The method according to claim 1, wherein the aeriform substance is produced by heating and subliming the material, and the crystallization is performed by cooling the aeriform substance and by allowing the aeriform substance and a reactive gas to react with each other.

6. The method according to claim 5, wherein the aeriform substance is supplied to a crystal generation region by a carrier gas, and the single crystal is grown in the crystal generation region.

7. The method according to claim 5, wherein the single crystal is grown in an atmosphere of a nitrogen (N) containing gas.

8. The method according to claim 7, wherein the nitrogen (N) containing gas is a mixed gas containing $NH_3$ and $N_2$.

9. The method according to claim 5, wherein the reactive gas includes at least a $NH_3$ gas, and further includes at least one selected from the group consisting of a $N_2$ gas and inert gas.

10. The method according to claim 5, wherein the material is at least one selected from the group consisting of Ga and GaN powder.

11. The method according to claim 6, wherein a temperature (T1(°C)) of the material and a temperature (T1(°C)) of the crystal generation region are controlled independently, and the single crystal is grown while satisfying T1>T2.

12. The method according to claim 6, wherein the carrier gas includes at least one selected from the group consisting of a $N_2$ gas, inert gas, and hydrogen gas.

13. The method according to claim 6, wherein the nitrogen (N) containing gas includes impurities so that the impurities are introduced into the GaN single crystal.

14. The method according to claim 1, wherein the aeriform substance is produced by heating and evaporating the material, and the crystallization is performed by allowing the aeriform substance and a reactive gas to react with each other.

15. The method according to claim 14, wherein the aeriform substance is supplied to a crystal generation region by a carrier gas, and the single crystal is grown in the crystal generation region.

16. The method according to claim 14, wherein the single crystal is grown in an atmosphere of a nitrogen (N) containing gas.

17. The method according to claim 16, wherein the nitrogen (N) containing gas includes at least one selected from the group consisting of $N_2$ gas and inert gas.

18. The method according to claim 14, wherein the carrier gas includes at least one selected from the group consisting of a $N_2$ gas, inert gas, and hydrogen gas.

19. The method according to claim 14, wherein the reactive gas includes at least a $NH_3$ gas, and further includes at least one selected from the group consisting a $N_2$ gas and inert gas.

20. The method according to claim 15, wherein the nitrogen (N) containing gas includes impurities are introduced into the GaN single crystal.

21. The method according to claim 14, wherein the material is heated, decompressed, and evaporated.

22. The method according to claim 21, wherein the aeriform substance is supplied to a crystal generation region by a carrier gas, and the single is grown in the crystal generation region.

23. The method according to claim 21, wherein the single crystal is grown in an atmosphere of a nitrogen (N) containing gas.

24. The method according to claim 23, wherein the nitrogen (N) containing gas includes at least one selected from the group consisting of a $N_2$ gas and inert gas.

25. The method according to claim 22, wherein the carrier gas includes at least one selected from the group consisting of a $N_2$ gas, inert gas, and hydrogen gas.

26. The method according to claim 21, wherein the reactive gas includes at least a $NH_3$ gas, and further includes at least one selected from the group consisting of a $N_2$ gas and inert gas.

27. The method according to claim 21, wherein the material is GaN powder.

28. The method according to claim 23, wherein the nitrogen (N) containing gas includes impurities so that the impurities are introduced into the GaN single crystal.

29. The method according to claim 1, wherein the material is heated at 300° C to 2400° C.

30. The method according to claim 1, wherein the material is added during a process of growing the single crystal.

31. The method according to claim 1, wherein a Group III nitride is prepared as a nucleus of crystal growth, and then the single crystal is grown on the surface of the nucleus.

32. The method according to claim 31, wherein the Group III nitride that serves as a nucleus is a single crystal or amorphous.

33. The method according to claim 31, wherein the Group III nitride that serves as a nucleus is in the form of a thin film.

34. The method according to claim 33, wherein the thin film is formed on a substrate.

35. The method according to claim 31, wherein the Group III nitride that serves as a nucleus has a maximum diameter of not less than 2 cm.

36. The method according to claim 31, wherein the Group III nitride that serves as a nucleus has a maximum diameter of not less than 3 cm.

37. The method according to claim 31, wherein the Group III nitride that serves as a nucleus has a maximum diameter of not less than 5 cm.

38. The method according to claim 1, wherein the single crystal is grown on a substrate.

39. The method according to claim 38, wherein the substrate is made of at least one material selected from the group consisting of amorphous gallium nitride (GaN), amorphous aluminum nitride (AlN), sapphire silicon (Si), gallium arsenide (GaAs), gallium nitride (GaN), aluminum nitride (AlN), silicon carbide (SiC), boron nitride (BN), lithium gallium oxide ($LiGaO_2$), zirconium diboride ($ZrB_2$), zinc oxide (ZnO), glass metal, boron phosphide (BP), $MoS_2$, $LaAlO_3$, NbN, $MnFe_2O_4$, ZrN, TiN, gallium phosphide (GaP), $MgAl_2O_4$, $NdGaO_3$, $LiAlO_2$, $ScAlMgO_4$, and $Ca_gLa_2(PO_4)_6O_2$.

40. The method according to claim 1, wherein a growth rate of the GaN single crystal is not less than 100 μm/h.

41. The method according to claim 31, wherein the Group III nitride is prepared in a crystal generation region, and then a reactive gas flows on the Group III nitride.

42. The method according to claim 1, comprising forming the aeriform substance that includes $GaH_x$ by heating and subliming or evaporating the material for the GaN single crystal in a presence of hydrogen.

43. The method according to claim 1, wherein the single crystal is grown under pressure.

44. A method of manufacturing a GaN single crystal comprising:
heating a material for the GaN single crystal in the presence of hydrogen, so that the material is sublimed or evaporated into an aeriform substance; and
crystallizing the aeriform substance to grow a GaN single crystal,
wherein the aeriform substance includes $GaH_x$ as the main component, and the GaN single crystal is grown by allowing the aeriform substance and a $NH_3$ gas to react with each other.

45. The method according to claim 44, wherein the single crystal is grown under pressure.

46. A method for manufacturing a GaN single crystal comprising:
generating or introducing a $GaH_x$ aeriform substance; and
growing a GaN single crystal by crystallizing the $GaH_x$ aeriform substance.

47. A method for manufacturing a GaN single crystal comprising:
growing a GaN single crystal by crystallizing an aeriform substance that includes $GaH_x$ as the main component.

48. The method according to claim 43, wherein the pressure is more than 1 atm and not more than 10000 atm (more than $1 \times 1.013 \times 10^5$ Pa and not more than $10000 \times 1.013 \times 10^5$ Pa).

* * * * *